US012698570B2

(12) United States Patent
Le et al.

(10) Patent No.: US 12,698,570 B2
(45) Date of Patent: Aug. 4, 2026

(54) HIGHLY REFLECTIVE METALLIC ALLOYS FOR COMPONENTS OF SEMICONDUCTOR PROCESSING EQUIPMENT, AND RELATED METHODS

(71) Applicant: Applied Materials, Inc., Santa Clara, CA (US)

(72) Inventors: Shawn Thanhson Le, San Jose, CA (US); Amir H. Tavakoli, San Jose, CA (US); Ala Moradian, Sunnyvale, CA (US); Tetsuya Ishikawa, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 594 days.

(21) Appl. No.: 18/117,318

(22) Filed: Mar. 3, 2023

(65) Prior Publication Data

US 2024/0295048 A1 Sep. 5, 2024

(51) Int. Cl.
*C30B 25/08* (2006.01)
*C30B 25/10* (2006.01)

(52) U.S. Cl.
CPC .............. *C30B 25/08* (2013.01); *C30B 25/10* (2013.01); *C30B 25/105* (2013.01)

(58) Field of Classification Search
CPC ....... C30B 25/08; C30B 25/105; C30B 25/10; C23C 16/46–483
See application file for complete search history.

(56) References Cited

U.S. PATENT DOCUMENTS

| | | | | |
|---|---|---|---|---|
| 5,179,677 A | * | 1/1993 | Anderson | ......... H01L 21/67115 |
| | | | | 392/416 |
| 6,212,004 B1 | * | 4/2001 | Stachowiak | .......... H01J 61/025 |
| | | | | 359/360 |
| 2001/0048568 A1 | * | 12/2001 | Ikeda | ................. G11B 5/59633 |

(Continued)

FOREIGN PATENT DOCUMENTS

WO WO-2014130088 A1 * 8/2014 .............. C22F 1/053

OTHER PUBLICATIONS

RS Alloys Overview, RSP Technology, 1 Page, https://www.rsp-technology.com/site-media/user-uploads/rsp_alloys_overview_2018Ir.pdf.

(Continued)

*Primary Examiner* — Aiden Lee
(74) *Attorney, Agent, or Firm* — Patterson + Sheridan, LLP

(57) ABSTRACT
Embodiments described herein generally relate to highly reflective metallic alloys for components (such as chamber components) of semiconductor processing equipment, and related methods and processing chambers. In one or more embodiments, a processing chamber applicable for use in semiconductor manufacturing includes a chamber body having an internal volume, and one or more heat sources configured to provide heat to the internal volume. The processing chamber includes an upper window and a lower window. The processing chamber includes one or more chamber components positioned to reflect energy emitted from the one or more heat sources through at least one of the upper window or the lower window and into the internal volume, the one or more chamber components comprising a metallic alloy and one or more reflective surfaces having a surface roughness (Ra) that is 5.0 nanometer or less.

15 Claims, 10 Drawing Sheets

(56) References Cited

U.S. PATENT DOCUMENTS

| | | | | |
|---|---|---|---|---|
| 2003/0047464 | A1* | 3/2003 | Sun | C25F 3/04 205/646 |
| 2004/0198181 | A1* | 10/2004 | Tajima | B24B 21/004 451/41 |
| 2012/0055915 | A1* | 3/2012 | Yokogawa | H05B 7/18 219/491 |
| 2014/0272459 | A1* | 9/2014 | Daugherty | C23C 28/345 438/758 |
| 2015/0337450 | A1* | 11/2015 | Shih | C25D 11/026 205/174 |
| 2015/0376760 | A1* | 12/2015 | Naim | C23C 4/134 427/454 |
| 2018/0130652 | A1 | 5/2018 | Pettinger et al. | |
| 2018/0135157 | A1* | 5/2018 | Jeong | C01F 17/218 |
| 2022/0098729 | A1* | 3/2022 | Wu | H01J 37/32357 |
| 2022/0115217 | A1* | 4/2022 | Yu | H01J 37/32733 |
| 2025/0242406 | A1* | 7/2025 | Liao | B22F 1/16 |

OTHER PUBLICATIONS

Bosch, Albert et al., "Optimisation strategy for aluminium optics using the meltspinning technology", Publication and Presentation at SPIE Conference 'OPTIFAB', May 12, 2009, pp. 1-24, https://www.rsp-technology.com/site-media/user-uploads/spie-optifab2009.pdf.

* cited by examiner

900

1200

800

1100

700

1000

1300

1400

1500

1505

GENERATE ENERGY FROM ONE OR
MORE HEAT SOURCES DISPOSED IN A
PROCESSING CHAMBER

1510

REFLECT THE GENERATED ENERGY OFF
OF ONE OR MORE CHAMBER
COMPONENTS

HIGHLY REFLECTIVE METALLIC ALLOYS FOR COMPONENTS OF SEMICONDUCTOR PROCESSING EQUIPMENT, AND RELATED METHODS

BACKGROUND

Field

Embodiments described herein generally relate to highly reflective metallic alloys for components (such as chamber components) of semiconductor processing equipment, and related methods and processing chambers.

Description of the Related Art

In the fabrication of integrated circuits, deposition processes are used to deposit films of various materials upon semiconductor substrates. Epitaxy is a deposition process that grows a thin, ultra-pure layer, usually of silicon or germanium, on a surface of a substrate. Forming an epitaxial layer on a substrate with uniform thickness across the surface of the substrate can involve precise temperature control. A process temperature is controlled through the use of heat sources. However, energy generated can be lost to areas away from the substrate being processed. Moreover, it can involve expensive components to direct the energy toward the substrate. The components can also be expensive to replace. It can also be difficult to manufacture the components that direct energy toward the substrate.

Thus, there is a need for an improved chamber component for a process chamber that facilitates directing energy toward the substrate in a manner that is cost-effective and efficient.

SUMMARY

Embodiments described herein generally relate to chamber components having metallic alloys, processing chambers, and related methods, for semiconductor manufacturing. In one or more embodiments, a chamber component including a metallic alloy is a reflector or a heat shield for disposition in a processing chamber.

In one or more embodiments, a processing chamber applicable for use in semiconductor manufacturing includes a chamber body having an internal volume, and one or more heat sources configured to provide heat to the internal volume. The processing chamber includes a substrate support disposed in the internal volume, and the substrate support includes a support surface. The processing chamber includes an upper window disposed over the substrate support, and a lower window disposed below the substrate support. The processing chamber includes one or more chamber components positioned to reflect energy emitted from the one or more heat sources through at least one of the upper window or the lower window and into the internal volume, the one or more chamber components comprising a metallic alloy and one or more reflective surfaces having a surface roughness (Ra) that is 5.0 nanometer or less.

In one or more embodiments, a chamber component for use in a semiconductor processing chamber includes a cylindrical body. The cylindrical body includes a metallic alloy material and one or more reflective surfaces having a surface roughness (Ra) that is 5.0 nanometer or less.

In one or more embodiments, a method for substrate processing for use in semiconductor manufacturing includes generating energy from one or more heat sources disposed in a processing chamber. The method includes reflecting the generated energy off of one or more chamber components and through a window towards an internal volume the processing chamber. The one or more chamber components comprising a metallic alloy and one or more reflective surfaces having a surface roughness (Ra) that is 5.0 nanometer or less.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
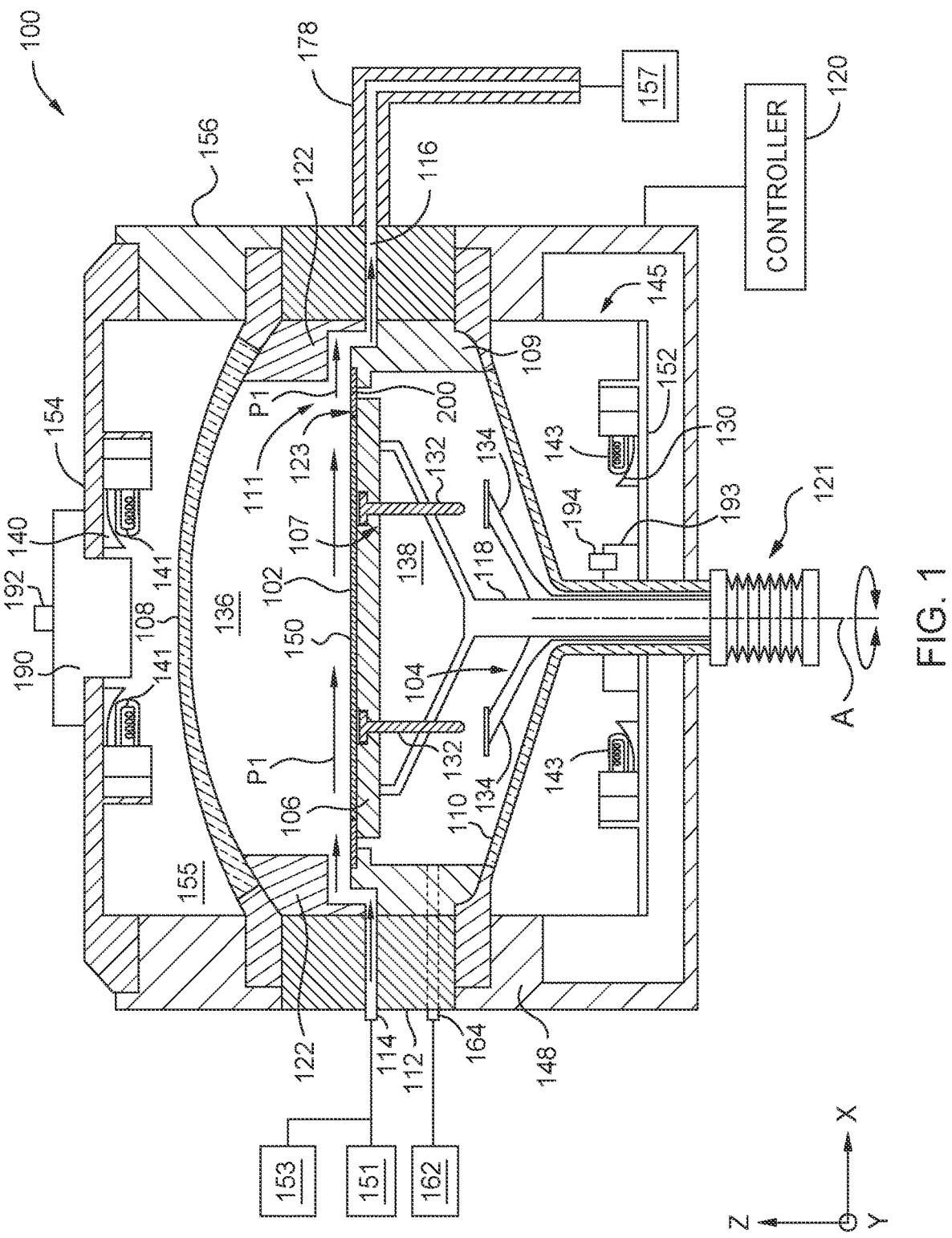
FIG. 1 is a partial schematic side cross-sectional view of a processing chamber including a process kit, according to one or more embodiments.

In this disclosure, the terms "top", "bottom", "side", "above", "below", "up", "down", "upward", "downward", "horizontal", "vertical", and the like do not refer to absolute directions. Instead, these terms refer to directions relative to a non-specific plane of reference. This non-specific plane of reference may be vertical, horizontal or other angular orientation.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to components (such as chamber components) having metallic alloys with a polished surface finish and high reflectivity, processing chambers, and related methods, for semiconductor manufacturing. In one or more embodiments, a chamber component including a metallic alloy is a reflector or a heat shield for disposition in a processing chamber. The present disclosure contemplates that the chamber component can be another form of a chamber component, such as another component that may be used to reflect thermal energy. The reflectors and heat shields are used in a semiconductor process chamber. The semiconductor process chamber may be used for an epitaxial deposition process, or rapid thermal processing, for example. The metallic alloy includes a unique microstructure that can be fully amorphous, partially amorphous and partially crystalline, or fully crystalline, depending on the post heat-treatment process used on the alloy. The metallic alloy may be coated with an infrared (IR) transparent material to facilitate protecting the reflective surface of the material from degradation while maintaining the reflective properties of the reflective surface of the metallic alloy.

The chamber components that include the metallic alloy can be used to direct thermal energy (e.g., infrared light) emitted by a heat source to a substrate disposed within the process chamber. The subject matter herein facilitates reduced manufacturing time, reduced costs, and increased operational lifespans. For example, other chamber components (such as chamber components coated with gold) can involve time intensive and costly machining and coating, and can delay operations should a replacement be needed. As another example, gold is a material that involves a relatively high cost. Moreover, as reflectivity degrades over time, the costly gold needs to be reapplied.

The present disclosure includes a highly polished metallic alloy with a smooth surface finish and high reflectivity. The metallic alloy is fabricated and polished to have the reflectivity, and may not need an additional reflective coating. As such, the semiconductor process chamber component itself is simplified, making the component easier to manufacture and maintain over time. In addition, this material selection leads to faster reproduction of replacement parts and less processing chamber downtime. Moreover, the reflector provides improved performance and longer service life. Further, cost savings are achieved in reducing or eliminating the use of gold material.

FIG. 1 is a partial schematic side cross-sectional view of a processing chamber 100 including a process kit 111, according to one or more embodiments. The processing chamber 100 is a deposition chamber. In one or more embodiments, the processing chamber 100 is an epitaxial deposition chamber. The processing chamber 100 is utilized to grow an epitaxial film on a substrate 102. The processing chamber 100 creates a cross-flow of precursors across a top surface 150 of the substrate 102. In one or more embodiments, the processing chamber 100 is used for rapid thermal processing. The process chamber 100 can operate under vacuum, such as, at reduced pressures or near atmospheric pressure.

The processing chamber 100 includes an upper body 156, a lower body 148 disposed below the upper body 156, and a flow module 112 disposed between the upper body 156 and the lower body 148. The upper body 156, the flow module 112, and the lower body 148 form at least part of a chamber body. Disposed within the chamber body is a substrate support 106, an upper window 108 (such as an upper dome), a lower window 110 (such as a lower dome), a plurality of upper heat sources 141, and a plurality of lower heat sources 143. As shown, a controller 120 is in communication with the processing chamber 100 and is used to control processes and methods, such as the operations of the methods described herein.

In one or more embodiments, the heat sources (such as the heat sources 141, 43) discussed herein include radiant heat sources such as lamps, for example halogen lamps. The present disclosure contemplates that other heat sources may be used (in addition to or in place of the lamps) for the various heat sources described herein. For example, resistive heaters, light emitting diodes (LEDs), and/or lasers may be used for the various heat sources described herein.

The substrate support 106 is disposed between the upper window 108 and the lower window 110. The substrate support 106 includes a support face 123 that supports the substrate 102.

The plurality of upper heat sources 141 are disposed between the upper window 108 and a lid 154. The plurality of upper heat sources 141 form a portion of the upper heat source module 155. Upper heat sources 141 provide heat to the substrate 102 and/or the substrate support 106. Upper heat sources 141 can be, for example, tungsten filament heat sources or higher power LEDs. The plurality of upper heat sources 141 can direct radiation, such as infrared radiation, through the upper window 108 to heat the substrate 102 and/or the substrate support 106. The lid 154 may include a plurality of sensors disposed therein for measuring the temperature within the processing chamber 100.

The plurality of lower heat sources 143 are disposed between the lower window 110 and a floor 152. The plurality of lower heat sources 143 form a portion of a lower heat source module 145. Lower heat sources 143 can be, for example, tungsten filament heat sources or higher power LEDs. The plurality of lower heat sources 143 can direct radiation, such as infrared radiation, through the lower window 110 to heat the substrate 102 and/or the substrate support 106.

The upper heat sources 141 above the substrate support 106 can be installed adjacent to an upper shell assembly 190 and within or adjacent to an upper reflector 140. The upper reflector 140 can surround the perimeter of the upper shell assembly 190. Generally, the upper reflector 140 and/or the upper shell assembly 190 can be formed of a reflective metallic alloy, such as a reflective aluminum alloy. An upper temperature sensor 192, such as a pyrometer, can be installed in or adjacent to the upper shell assembly 190 to detect a temperature of the substrate 102 during processing.

Lower heat sources 143 can be installed within or adjacent to a lower reflector 130 and within or adjacent to a lower shell assembly 193. The lower reflector 130 can surround the lower shell assembly 193. Generally, the lower reflector 130 and/or the lower shell assembly 193 can be formed at least partially (such as partially or entirely) of a reflective metallic alloy, for example a reflective aluminum alloy. A lower temperature sensor 194, such as a pyrometer, can be installed in the lower shell assembly 193 to detect a temperature of the substrate support 106 or the back side of the substrate 102. One or both of the lower reflector 130 and/or the lower shell assembly 193 may be fabricated as later described below with reference to an upper shell assembly 190 and/or an upper reflector 140.

Although FIG. 1 shows the same size and number of heat sources 141, 143 installed above and below the upper and lower windows, 108, and 110 respectively, different types, intensity, wavelength, numbers, and/or sizes of heat sources may be installed within or adjacent to one or more of the reflectors 130, 140. Additionally, upper heat sources 141 and lower heat sources 143 may be disposed in additional and/or alternative locations.

The upper reflector 140, the lower reflector 130, the upper shell assembly 190, and the lower shell assembly 193 (and/or other component(s) including the metallic alloy) can be manufactured by processes such as, but not limited to, melt spinning, or any other process including rapid liquid quenching, gaseous quenching, and/or rate-controlled chemical and solid reactions. One or more surfaces of the metallic alloy can further be smoothened for increased surface reflectivity. In one or more embodiments, the metallic alloy is an aluminum alloy. In one or more embodiments, the metallic alloy is a brass alloy that includes copper and zinc. In one or more embodiments, the metallic alloy includes a post-transition metal (such as aluminum) and one or more transition metals (such as one or more of iron, nickel, copper, manganese, molybdenum, and/or zirconium). The metallic alloy has an alloy composition that includes a post-transition atomic percentage (such as an aluminum atomic percentage) that is at least 80% and a transition atomic percentage of the one or more transition metals that is at least 5%. In one or more embodiments, a sum of the post transition atomic percentage and the transition atomic percentage is at least 95%.

In one or more embodiments, the metallic alloy includes aluminum (e.g., having an aluminum atomic percentage of at least 80%) and at least one of silicon, copper, and/or magnesium (e.g., having a combined atomic percentage of at least 5%). In one or more embodiments, a sum of the aluminum atomic percentage and the combined atomic percentage is at least 95%.

The smoothening of the one or more outer surfaces includes polishing the one or more outer surfaces. In one or more embodiments, the polishing includes magnetorheological finishing (MRF). In one or more embodiments, the polishing includes plasma electrolytic polishing. Other polishing techniques are contemplated.

Using the metallic alloy, an additional reflective coating may not be needed since the metallic alloy itself already has, or can be polished to have, a high reflectivity. In addition, the metallic alloy has high shape stability, low thermal expansion, high thermal conductivity, and is lightweight.

Reflectivity of light on the surface of a material depends on the surface finish and also on the microstructure of crystals on the surface. Such as by using melting, the metallic alloy is formed with a unique structure. That is, instead of the solid metallic alloy being composed of discrete organized large crystals as in some microstructures, the metallic alloy is formed of a microstructure with no specific organization or organized grain boundaries. To facilitate obtaining desired properties for a targeted application, an amorphous microstructure can be further tailored by thermal processing to a partially amorphous structure containing ultra-fine crystals or to a completely crystallized structure with ultra-fine crystals. In this way, ultra-fine crystals can be formed in the microstructure. In one or more embodiments, the metallic alloy has ultra-fine crystalline grains on the surface, and has high surface reflectivity. Further, polishing and surface finishing of the metallic alloy causes the surface roughness to be equal to or less than 5 nanometer, such as equal to or less than 1 nanometer. This reduced surface roughness increases the reflectivity of the metallic alloy.

A reflectivity of one or more reflective surfaces of the chamber component(s) that include the metallic alloy is at least 90% for energy (e.g., light) having a wavelength in the infrared range. In one or more embodiments, the reflectivity is within a range of 90% to 99%. In one or more embodiments, the reflectivity is at least 95%, such as at least 98%.

When the disclosed metallic alloy is used as a chamber component (such as upper reflector 140 or lower reflector 130) in a processing chamber 100, it can get very hot due to its proximity to upper heat sources 141 and/or lower heat sources 143. At these high temperatures, the reflective surface(s) of the reflectors can get very hot and therefore oxidized to the pressure of the surrounding air. This oxidation in turn can reduce the reflectivity of the reflective surface(s) of the metallic alloy. To reduce or eliminate the oxidation and/or reflectivity reduction, the metallic alloy can be coated with an IR transparent protective coating (shown, for example, as IR transparent protective coating 280 in FIG. 2B).

In one or more embodiments, the IR transparent protective coating is a single thin layer of material, includes multiple thin layers of materials, or includes a laminated layer structure. The IR transparent coating may include one or more of a metal oxide layer, a metal fluoride layer, and/or a metal oxyfluoride layer. In one or more embodiments, the IR transparent coating is a stack of layers, with each layer in the stack having one or more of an oxide, fluoride, and/or oxyfluoride composition. In one or more embodiments, the IR transparent coating is made of at least one of: aluminum oxide, other oxide(s), magnesium fluoride, other fluoride(s), magnesium oxyfluoride, and/or other oxyfluoride(s). The present disclosure contemplates that other IR transparent materials may be used for the IR transparent protective coating. With the IR transparent protective coating, the reflectivity of the underlying metallic alloy can be used while facilitating protection of the metallic alloy from oxidation. The IR transparent protective coating can be formed by flowing ozone while conducting a deposition operation (such as an atomic layer deposition (ALD) or chemical vapor deposition (CVD) operation) on the metallic alloy. The materials described facilitate a strong adhesion of the IR transparent protective coating to the metallic alloy.

Some or all of the upper reflector 140, the lower reflector 130, the upper shell assembly 190, and the lower shell assembly 193 may be composed at least partially, such as partially or wholly, from the metallic alloy disclosed herein. The reflectivity of the metallic alloy is suitable for directing light toward the substrate 102 or away from a location where light is undesired, without the need for any additional reflective coating used in other systems, such as gold. The metallic alloy may be encased in an IR transparent protective coating as discussed above. The IR transparent protective coating may be disposed over the one or more reflective surfaces of the chamber component(s). In one or more embodiments, the IR transparent protective coating is an aluminum oxide layer. In one or more embodiments, the IR transparent protective coating has a thickness T1 (shown in FIG. 2B) within a range of about 5 nm to about 300 nm, such as within a range of about 5 nm to about 200 nm. In one or more embodiments, the thickness T1 of the IR transparent protective coating is less than 150 nm, such as less than 100 nm. In one or more embodiments, the thickness T1 is within a range of 10 nm to 100 nm, such as within a range of 10 nm to 60 nm. The IR transparent protective coating is transmissive for at least 90% (such as at least 95%, for example 98% or more) of energy (e.g., light) having a wavelength in the infrared range (such as about 700 nm to 1 mm). In one or more embodiments, the IR transparent protective coating is a magnesium fluoride layer having the thickness T1. If used, the thickness T1 of the magnesium fluoride layer may be within a range of about 20 nm to about 1 μm. The IR transparent protective coating protects the polished reflective surface(s) of the metallic alloy while having reduced or eliminated effects on the reflectivity of the metallic alloy, which may have a reflectance of 90% or more.

All, some, or none of the upper reflector 140, the lower reflector 130, the upper shell assembly 190, and the lower shell assembly 193 may be manufactured from the metallic alloy discussed herein, and/or may include one or more reflective surface(s) that are surface treated (e.g., polished) to a surface roughness (Ra) that is 15.0 nm or less. In one or more embodiments, the surface roughness (Ra) is 5.0 nm or less. In one or more embodiments, the surface roughness (Ra) is within a range of 0.2 nm to 5.0 nm. In one or more embodiments, the surface roughness (Ra) is 1.0 nm or less, such as 0.5 nm or less. Similarly, all, some or none of the upper reflector 140, the lower reflector 130, the upper shell assembly 190, and the lower shell assembly 193 may have the IR transparent protective coating coated on the one or more reflective surfaces thereof. The present disclosure contemplates that the metallic alloy, the polished reflective surface(s) thereof, and/or the IR transparent protective coating can be used for at least part of any chamber component that is used to reflect thermal energy (e.g., light).

The upper window 108 and the lower window 110 are formed of an energy transmissive material, such as quartz, and may be transparent in various embodiments, to allow heat to pass from the upper heat sources 141 and lower heat sources 143 to the substrate 102 and/or the substrate support 106.

A process volume 136 and a purge volume 138 are formed between the upper window 108 and the lower window 110. The process volume 136 and the purge volume 138 are part of an internal volume defined at least partially by the upper window 108, the lower window 110, an upper liner 122, and one or more lower liners 109.

The internal volume has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106 within the processing volume 136.

The substrate support 106 may include lift pin holes 107 disposed therein. The lift pin holes 107 are sized to accommodate lift pins 132 for lowering and lifting of the substrate 102 to and from the substrate support 106 before or and a deposition process is performed. The lift pins 132 may rest on lift pin stops 134 when the substrate support 106 is lowered from a process position to a transfer position. The lift pin stops 134 can be coupled to a second shaft 104 through a plurality of arms.

The flow module 112 includes a plurality of gas inlets 114, a plurality of purge gas inlets 164, and one or more gas exhaust outlets 116. In one or more embodiments, the plurality of gas inlets 114 and the plurality of purge gas inlets 164 are disposed on the opposite side of the flow module 112 from the one or more gas exhaust outlets 116. The upper liner 122 and the lower liners 109 are disposed on an inner surface of the flow module 112 and protect the flow module 112 from reactive gases used during deposition operations and/or cleaning operations. The gas inlet(s) 114 and the purge gas inlet(s) 164 are each positioned to flow a gas parallel to the top surface 150 of a substrate 102 disposed within the process volume 136. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. One or more process gases supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 162 can include one or more inert gases (such as one or more of argon (Ar), helium (He), hydrogen ($H_2$), and/or nitrogen ($N_2$)). One or more cleaning gases supplied using the one or more cleaning gas sources 153 can include one or more of hydrogen (H) and/or chlorine (Cl). In one or more embodiments, the one or more process gases include silicon phosphide (SiP) and/or phospine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. In one or more embodiments, the exhaust system 178 is disposed on an opposite side of the processing chamber 100 relative to the gas inlet(s) 114 and/or the purge gas inlets 164.

A pre-heat ring 200 is disposed outwardly of the substrate support 106. The pre-heat ring 200 is supported on a ledge of the one or more lower liners 109. In one or more embodiments, the pre-heat ring 200 and/or the liners 109, 113, and/or 122 are formed of one or more of quartz (such as transparent quartz, e.g. clear quartz; opaque quartz, e.g., white or grey quartz; and/or black quartz), silicon carbide (SiC), and/or graphite coated with SiC.

During processing, one or more process gases P1 flow from the gas inlet(s) 114, into the processing volume 136, and over the substrate 102 to form (e.g., epitaxially grow) one or more layers on the substrate 102 while the heat sources 141, 143 heat the pre-heat ring 200 and the substrate 102. After flowing over the substrate 102, the one or more process gases P1 flow out of the internal volume through the one or more gas exhaust outlets 116. The flow module 112 can be at least part of a sidewall of the processing chamber 100. The present disclosure also contemplates that one or more purge gases can be supplied to the purge volume 138

(through the plurality of purge gas inlets 164) during the deposition operation, and exhausted from the purge volume 138

Figure 2A:
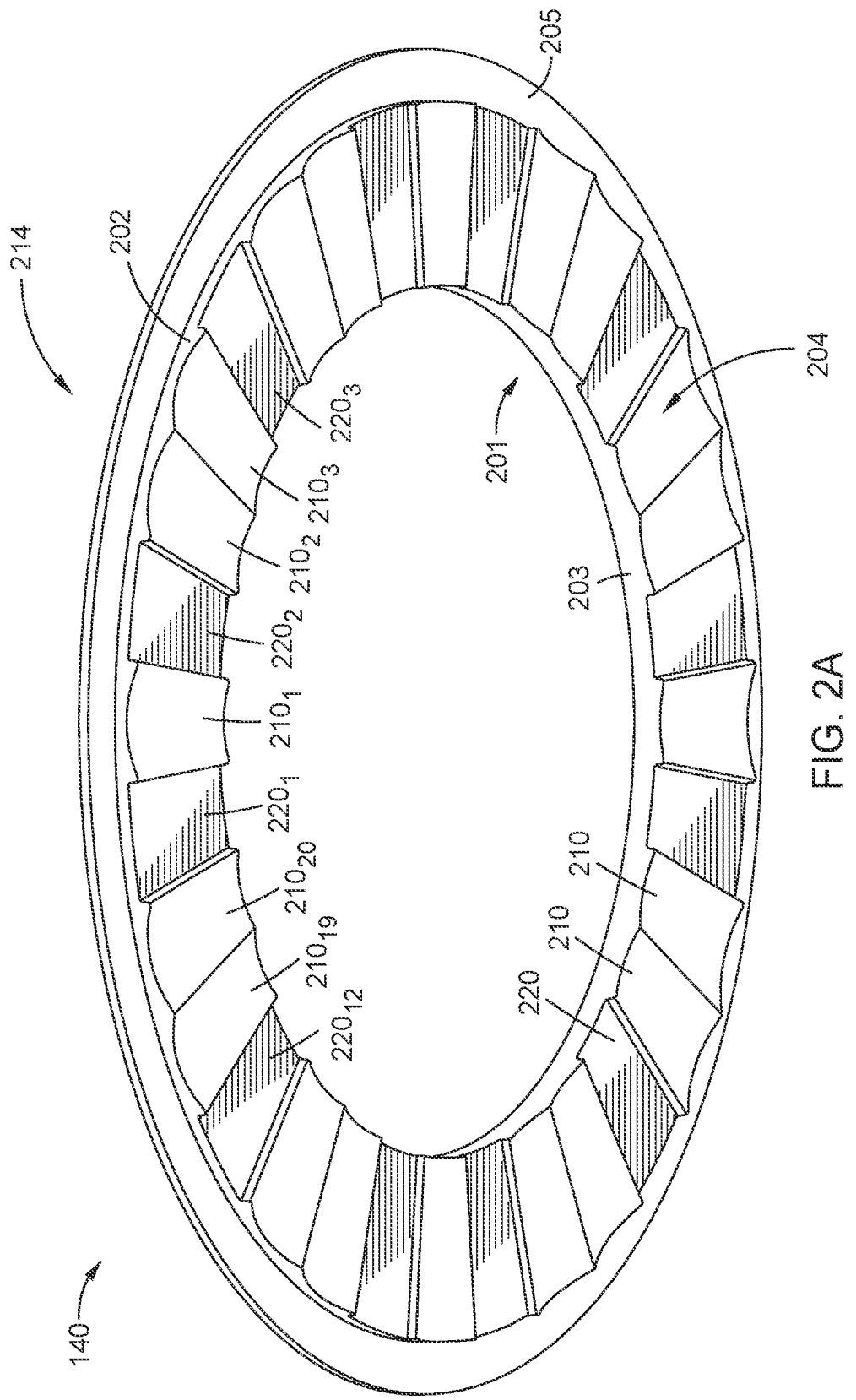
FIG. 2A is a schematic bottom perspective view of a reflector to be used in the processing chamber of FIG. 1, according to one or more embodiments.
Figure 2B:
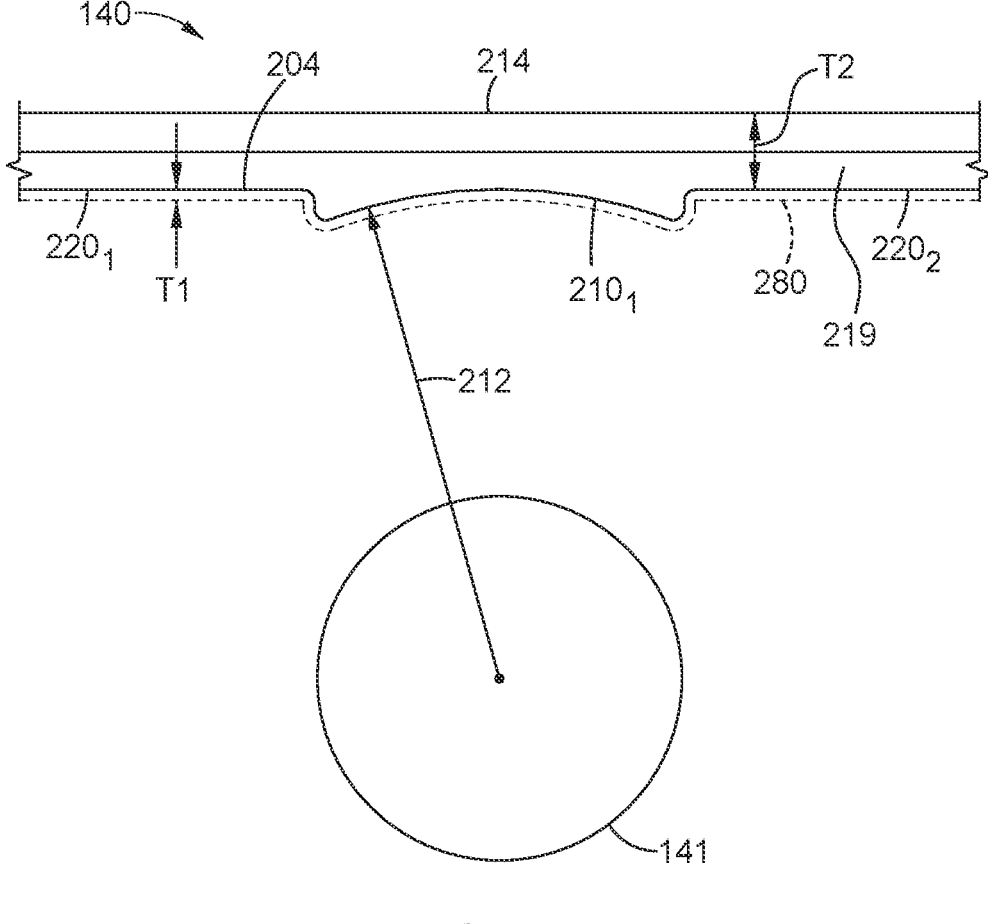
FIG. 2B is a schematic partial side sectional view of the reflector of FIG. 2A, according to one or more embodiments.

FIGS. 2A-2B are a schematic bottom and partial side sectional views of the upper reflector 140 of FIG. 1, according to one or more embodiments. The upper reflector 140 includes an annular body 201 (which can be referred to as the "cylindrical body") having an outer edge 202, an inner edge 203, a top side 214, and a bottom side 204. The upper reflector 140 further includes an outer rim 205 disposed above and outward of the bottom side 204 of the annular body 201. In one or more embodiments, the cylindrical body is a ring shaped body with a center opening as shown in FIG. 2A. In one or more embodiments, the outer rim 205 can be used to align the upper shell assembly 190 to the processing chamber 100. The bottom side 204 includes a plurality of concave reflector structures, which include first reflecting surfaces 210. The bottom side 204 also includes a plurality of second reflecting surfaces 220, which may be flat or concave. In one or more embodiments, the first reflecting surfaces 210 and the second reflecting surfaces 220 include an IR transparent protective coating 280 formed of an IR transparent material. The second reflecting surfaces 220 are shown with surface shading in FIG. 2A to further the second reflecting surfaces 220 from the first reflecting surfaces 210. Each first reflecting surface 210 and each second reflecting surface 220 is positioned at a different angular location relative to a centerline of the annular body 201. In one or more embodiments, the upper shell assembly 190 includes from about 16 to about 24 first reflecting surfaces 210, such as about 20 first reflecting surfaces 210. FIG. 2A is shown with 20 first reflecting surfaces 210 (see $210_{20}$). In one or more embodiments, the upper shell assembly 190 includes from about 8 to 16 second reflecting surfaces 220, such as about 12 second reflecting surfaces 220. FIG. 2A is shown with 12 second reflecting surfaces 220 (see $220_{12}$).

The partial side sectional view of FIG. 2B illustrates the reflecting surfaces $220_1$, $210_1$, and $220_2$ relative to the heat source 141. The heat sources 141 are disposed between the first reflecting surfaces 210 and the upper window 108 of the process chamber 100 (e.g., between the first reflecting surfaces 210 and the substrate support 106). In one or more embodiments, the heat sources 141 are not placed between the second reflecting surfaces 220 and the substrate support 106. For example, if the heat sources 141 are only placed beneath the first reflecting surfaces 210, then 20 heat sources 141 would be placed beneath the upper reflector 140 that includes 20 first reflecting surfaces 210.

The plurality of concave reflector structures (e.g., the first reflecting surfaces 21) are disposed around the annular body 201 in a circular array relative to a centerline of the cylindrical body. At least one of the first reflecting surfaces 210 is disposed between each second reflecting surface 220 in the circular array. The circular array can include one or more instances in which two or more first reflecting surfaces are arranged consecutively. For example, the circular array of the upper reflector 140 includes eight instances of two first reflecting surfaces 210 spaced consecutively. Furthermore, the circular array includes four instances in which one of the second reflecting surfaces 220 is disposed one position before and one position after one of the first reflecting surfaces 210.

Each first reflecting surface 210 has a curved surface having a radius of curvature 212 from about 1.50 inches to about 2.20 inches, such as from about 2.02 inches to about 2.10 inches. In one or more embodiments, each second reflecting surface 220 is substantially flat. In one or more embodiments, each first reflecting surface 210 has a partial cylindrical shape extending in a radial direction from the outer edge 202 towards the inner edge 203 of the upper reflector 140. In one or more embodiments, each first reflecting surface has a frustoconical shape extending in a direction from the outer edge 202 towards the inner edge 203 of the upper reflector 140. In embodiments having a frustoconical shape, the radius of curvature decreases in the radial direction from the outer edge 202 to the inner edge 203 of the reflector 140.

A body 219 of the upper reflector 140 is formed at least partially (such as partially or entirely) of the metallic alloy described above, and one or more of the reflecting surfaces 210, 220 are polished to have the surface roughness (Ra) that is 15.0 nm or less, such as 5.0 nm or less. The body 219 that is formed at least partially of the metallic alloy has a thickness T2. In one or more embodiments, thickness T2 is greater than the thickness T1.

Figure 3A:
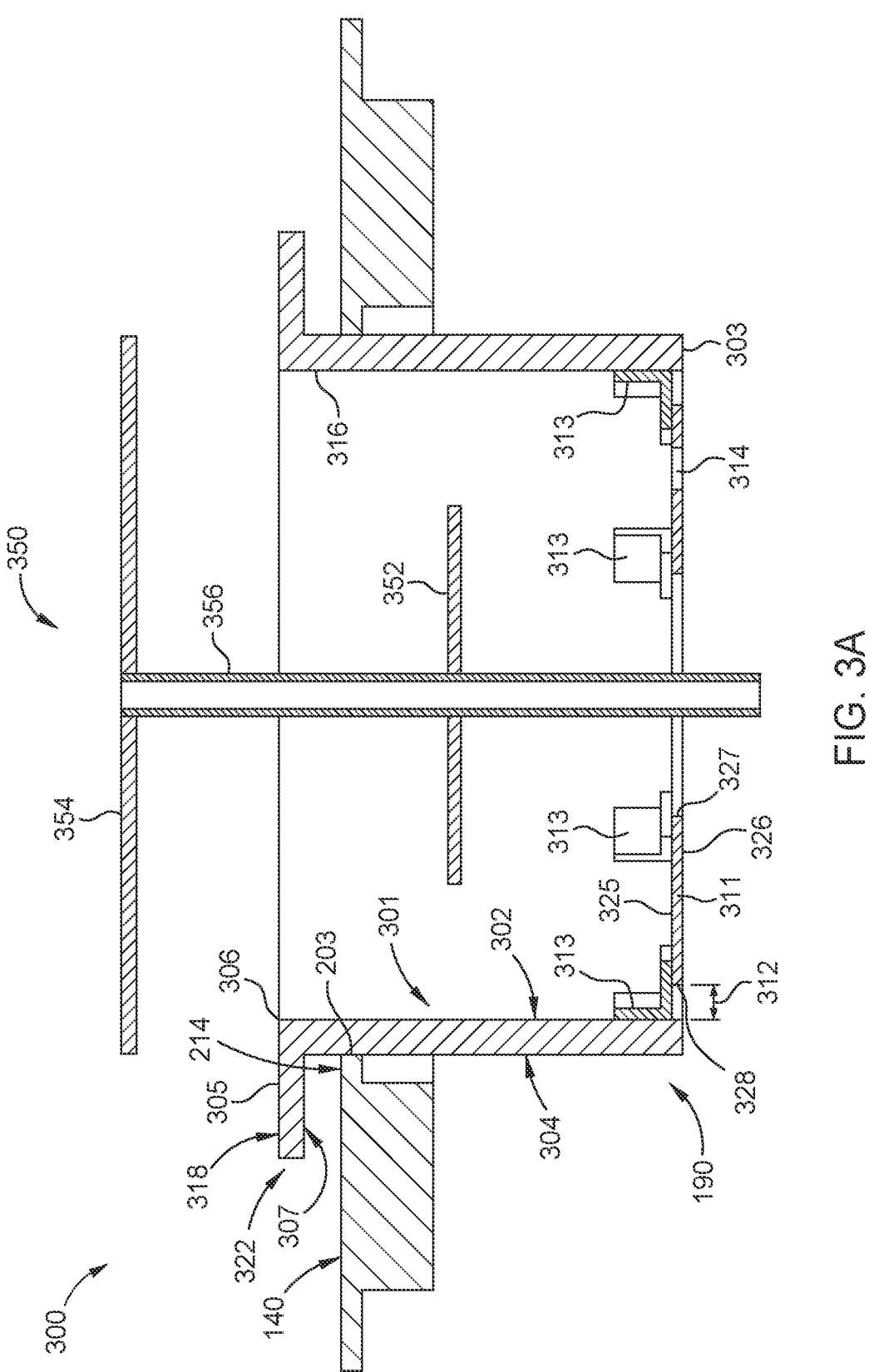
FIG. 3A is a schematic cross sectional view of a reflector assembly, according to one or more embodiments.

FIG. 3A is a schematic cross sectional view of a reflector assembly 300, according to one or more embodiments.

While the foregoing will discuss an embodiment of an upper reflector assembly, it should be understood, the same construction may apply to the lower reflector 130 introduced above. The reflector assembly 300 includes the upper shell assembly 190, the upper reflector 140, and a baffle structure 350. The upper shell assembly 190 includes a shell body 301, and a shell flange 305. The shell body 301 has a cylindrical shape with an inner diameter surface 302, and an outer diameter surface 304, a proximate end 316, and a distal end 303. The shell flange 305 has an upper surface 318, a lower surface 307, an inner diameter edge 306, and an outer diameter edge 322 that extends radially outward from the inner diameter surface 302 of the shell body 301. The shell flange 305 is connected to the proximate end 316 of the shell body 301 at the inner diameter edge 306 as a one piece monolithic structure. The upper shell assembly 190 may have an optional lower baffle 311 located at the distal end 303 of the shell body 301. The lower baffle 311 may be disk-shaped having a top and bottom surface, 325, 326, respectively, with an inner edge 327, and an outer edge 328. The lower baffle 311 may be a separate component connected to the shell body 301, or be connected to the distal end 303 of the shell body 301 as a one piece monolithic structure The baffle structure 350 includes a middle baffle 352, a top baffle 354, and a cylindrical sensor tube 356. The middle baffle 352 and the top baffle 354 have a disk shape and are disposed around a common centerline of the cylindrical sensor tube 356. The baffle structure 350 may be constructed of the same material as the upper reflector 140, or other suitable material, such as the metallic alloy discussed herein, and may be polished and/or coated similarly.

The lower baffle 311 may be connected to the inner diameter surface 302 of the shell body 301. The top surface 325 of the lower baffle 311 may be connected to the inner diameter surface 302 by connectors 313 in a manner that creates an annular gap 312 between the inner diameter surface 302 and the outer edge 328. The connector 313 may be a bracket or structure suitable for connecting the lower baffle 311 to the shell body 301. In one or more embodiments, the connectors 313 are a web of material extending between the outer edge 328 of the lower baffle 311 and the inner diameter surface 302 at the distal end 303 of the shell body 301 when the shell body 301 and lower baffle 311 are fabricated as a monolithic structure. Furthermore, it is contemplated the upper shell assembly 190, including the optional lower baffle 311 and baffle structure 350, are formed as a monolithic structure. The lower baffle 311 is constructed of the same material as the upper reflector 140 and polished and/or coated similarly. Furthermore, the lower baffle 311 may have a cut out 314 that enables a second temperature sensor, for example a pyrometer, to have a line of sight down to the edge of the substrate 160. The cylindrical sensor tube 356 is generally utilized to provide a line of sight for a first temperature sensor, for example the upper temperature sensor 192 shown in FIG. 1, down to the center of the substrate 160.

The shell assembly 190, including the lower baffle 311, may be constructed of the same material as the upper reflector 140 and polished and/or coated similarly. The shell assembly 190 is configured to be inserted adjacent to the inner edge 203 of the upper reflector 140. The outer diameter of shell flange 305 is greater than the inner diameter of the inner edge 203 of the upper reflector 140 causing a lower surface 307 of the shell flange 305 to make at least partial contact with the top side 214 of the upper reflector 140 when inserted within the cylindrical body of the upper reflector 140.

Figure 3B:
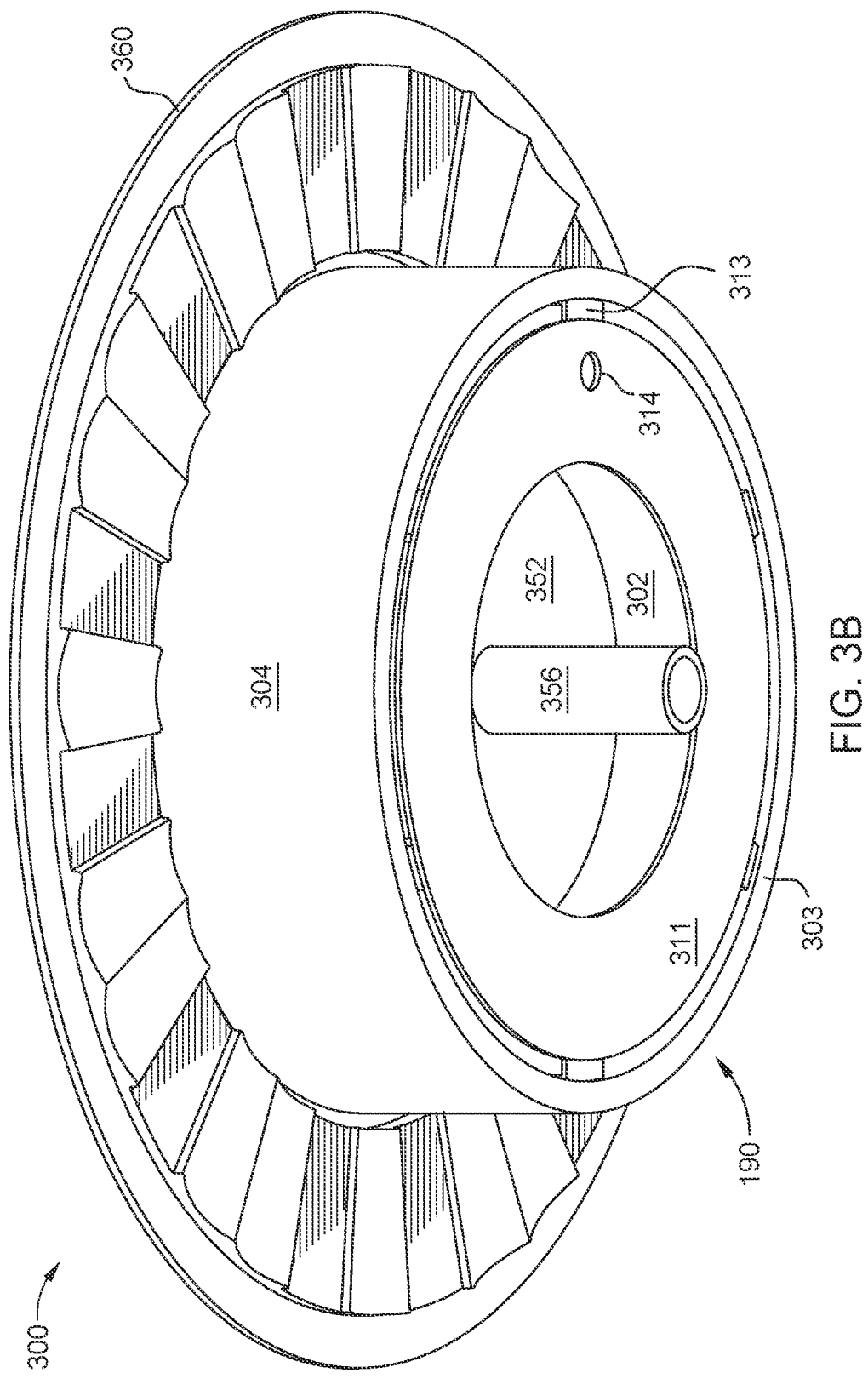
FIG. 3B is a schematic bottom perspective view of the reflector assembly including the upper shell assembly, the upper reflector, and the baffle structure, according to one or more embodiments.

FIG. 3B is a schematic bottom perspective view of the reflector assembly 300 including the upper shell assembly 190, the upper reflector 140, and the baffle structure 350, according to one or more embodiments. The reflector assembly 300 may be used in place of the upper reflector 140 described above in the processing chamber 100, or other suitable processing chamber. The cylindrical body 360 is configured similar to the upper reflector 140 described above, except that the cylindrical body 360 is interfaced with at least the shell body 301 to reduce unwanted reflections from disturbing measuring equipment, such as the upper temperature sensor 192 through cylindrical sensor tube 356.

As previously mentioned, a metallic alloy, such as an aluminum alloy material, may be used to manufacture the reflector assembly 300. The metallic alloy body, with or without the IR transparent protective coating, may be used on other components disposed on or within the chamber body that receive light or heat from heat source 141. These metallic alloy bodies are exposed to high temperature during operation of the process chamber 100 of FIG. 1. The metallic alloy(s) can be selected to withstand a temperature up to 300 degrees Celsius. To manage the temperature of the reflector assembly and prevent overheating, the metallic alloy materials may include fillers selected to improve thermal conductivity. Some fillers that may be used to improve thermal conductivity include but are not limited to boron nitride, aluminum nitride, silicon carbide, carbon, diamond, and/or metal powders including aluminum, iron, carbon nanotubes or similar carbon-based structures such as carbon fiber and/or graphene. In one or more embodiments, the metallic alloy bodies may include up to about 7 weight percent fillers.

Figure 4:
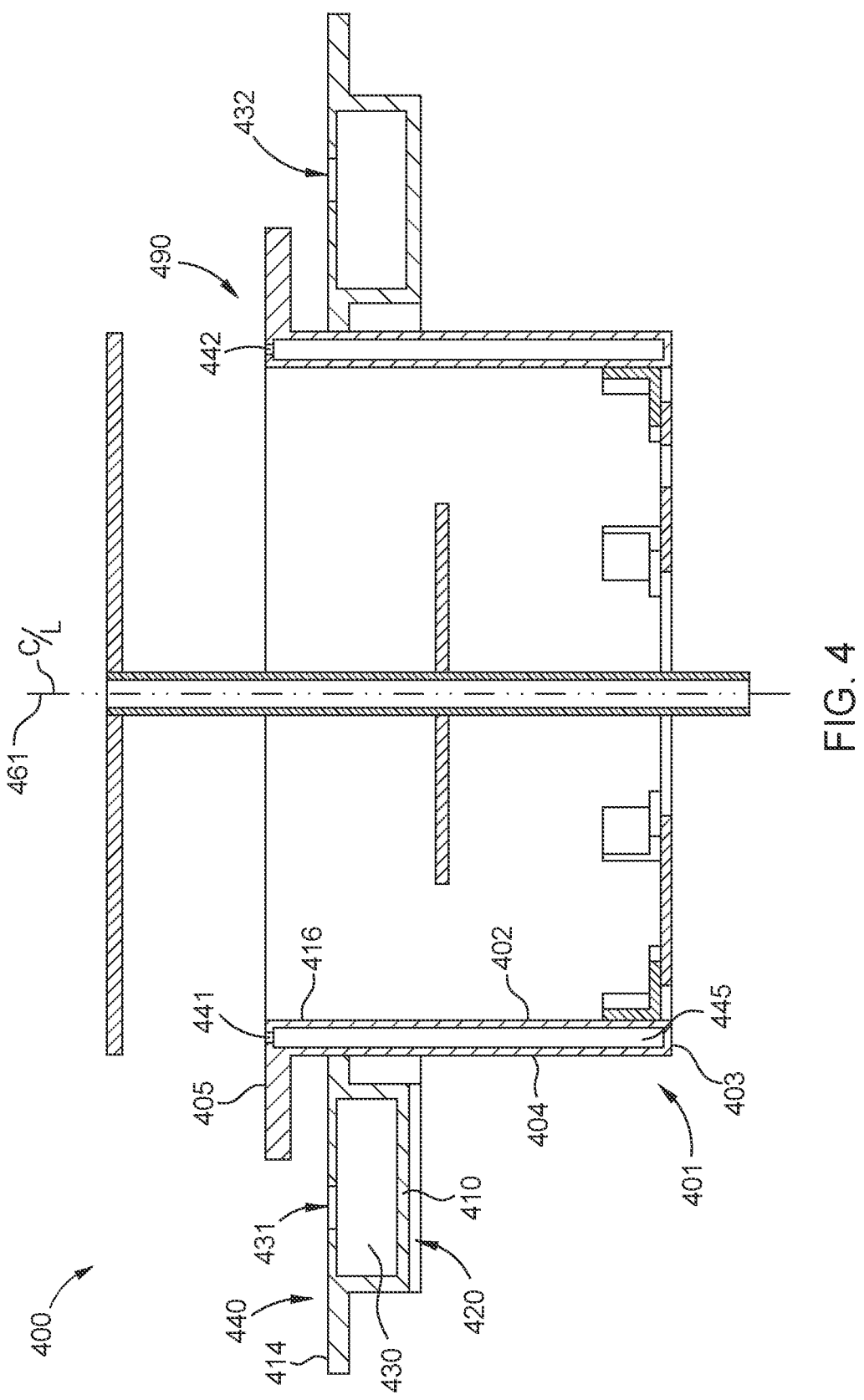
FIG. 4 is a schematic cross sectional view of a reflector assembly with cooling channels, according to according to one or more embodiments.

FIG. 4 is a schematic cross sectional view of a reflector assembly 400 with cooling channels within components of the reflector assembly 400, according to according to one or more embodiments. It is contemplated that the illustrated cooling channels may be similarly constructed in the designs of FIGS. 2A-6. The reflector assembly 400 includes an upper reflector 440 and the shell assembly 490 each possessing a cooling channel around a centerline 461. The diameter of cylindrical, annular, tube-like, or ring shaped components use the centerline 461 as the origin. The upper reflector 440 and the shell assembly 490 are contemplated to be constructed at least partially of the metallic alloy disclosed herein, and polished and/or coated similar to the reflector assembly 300.

The cavity 430 may be used to flow a cooling medium such as air, water, fluorinated heat transfer fluid, or some combination thereof to maintain the temperature of the reflector assembly 400 below the destruction temperature of the IR transparent protective coating 280, the annular body 410, or the heat sources 141 of FIGS. 2B, 4, and 1, respectively. In one or more embodiments, the cavity 430 is formed near a top side 414 of annular body 410 and recessed from the plurality of the concave structures 420. In one or more embodiments, the cavity 430 is formed near the plurality of the concave structures 420 and recessed from the top side 414 of annular body 410. In one or more embodiments, the cavity 430 substantially encompasses the height of the annular body 410 formed near the plurality of the concave structures 420 and near the top side 414. The cavity 430 may be a single annular enclosure that follows the annular body 410 disk shape. In one or more embodiments, the cavity 430 may be a divided annular enclosure containing multiple flow paths that follow the disk shape of the annular body 410.

In one or more embodiments, the top side 414 has a reflector inlet port 431 and a reflector outlet port 432. In one or more embodiments, the ports 431, 432 maybe side entry and exit ports. In one or more embodiments, the cavity 430 may be disposed on top of the top side 414 enabling cooling from the surface. The ports 431, 432 are used to allow flow to ingress and egress from the cavity 430. FIG. 4 illustrates the reflector inlet port 431 and the reflector outlet port 432 positioned 180 degrees from each other. It is contemplated that the spacing between the reflector inlet port 431 and the reflector outlet port 432 may be substantially next to each other or some distance in between.

Similarly, the shell assembly 490 includes a shell flange and a shell body 401 that contains a formed cavity 445 between the shell body 401 inner wall 402, an outer wall 404, a distal end 403, and a proximate end 416. A cavity 445 is formed between the inner and outer wall where a cooling medium may be provided to thermally regulate the shell body 401 and prevent overheating. The cavity 445 has a shell inlet port 441 and a shell outlet port 442. The ports 441, 442 allow the flow to ingress and egress of the cooling medium from the cavity 445. FIG. 4 illustrates the shell inlet port 441 and the shell outlet port 442 positioned 180 degrees from each other however it is contemplated that the spacing between the shell inlet port 441 and the shell outlet port 442 may be substantially next to each other or some distance in-between. In one or more embodiments, the shell inlet port 441 and the shell outlet port 442 may be side entry or exit ports of the shell assembly 490.

Figure 5:
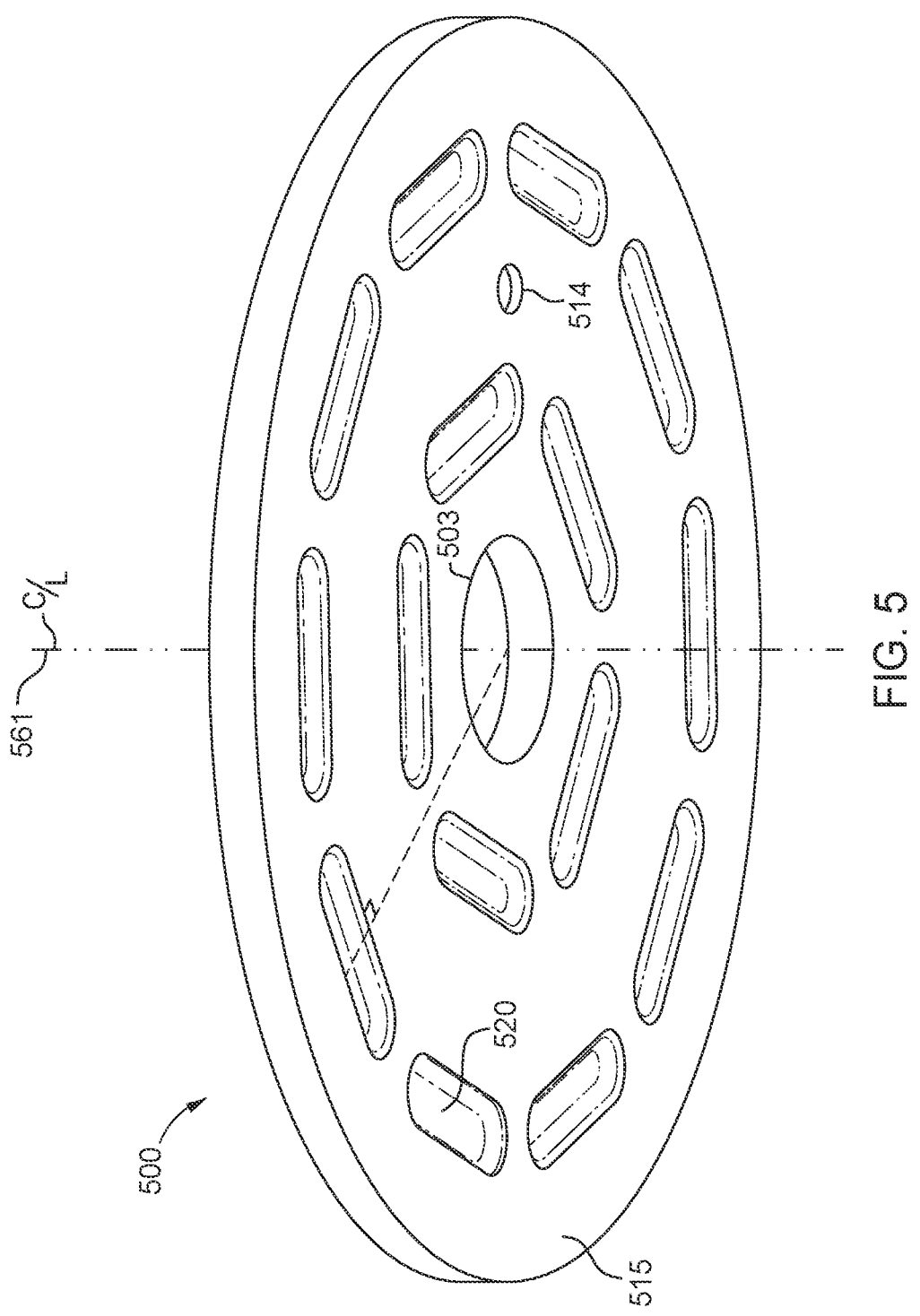
FIG. 5 is a schematic bottom perspective view of a reflector to be used in the processing chamber of FIG. 1, according to according to one or more embodiments.

FIG. 5 illustrates an embodiment of the reflector assembly 500 that includes a center hole 503 and a plurality of concave structures 520 configured to house a portion of an elongated heat source. The concave structures 520 are shown in an annular tangential orientation on the under surface 515 of reflector assembly 500 which can be used in the process chamber 100 of FIG. 1. The angle of the axis of elongation of each of the plurality of concave structures 520 is orientated at about 90 degrees relative to the radius of the reflector assembly 500. Thus, the concave structures 520 have a tangential orientation. However, the angle of the plurality of concave structures 520 may be arranged at other non-zero angles relative to the radius of the reflector assembly 500. In one or more embodiments, the plurality of concave structures 520 are arranged in a polar array in a common diameter outward of a centerline 561 of the cylindrical body. The reflector assembly 500 may be manufactured from the metallic alloy discussed herein, and polished and/or coated with an IR transparent protective coating, such as, aluminum oxide and magnesium fluoride, among others. The center hole 503 and the cut out 514 may be used to enable the upper temperature sensor 192 and/or other sensor to monitor the substrate 160 shown in FIG. 1.

Figure 6:
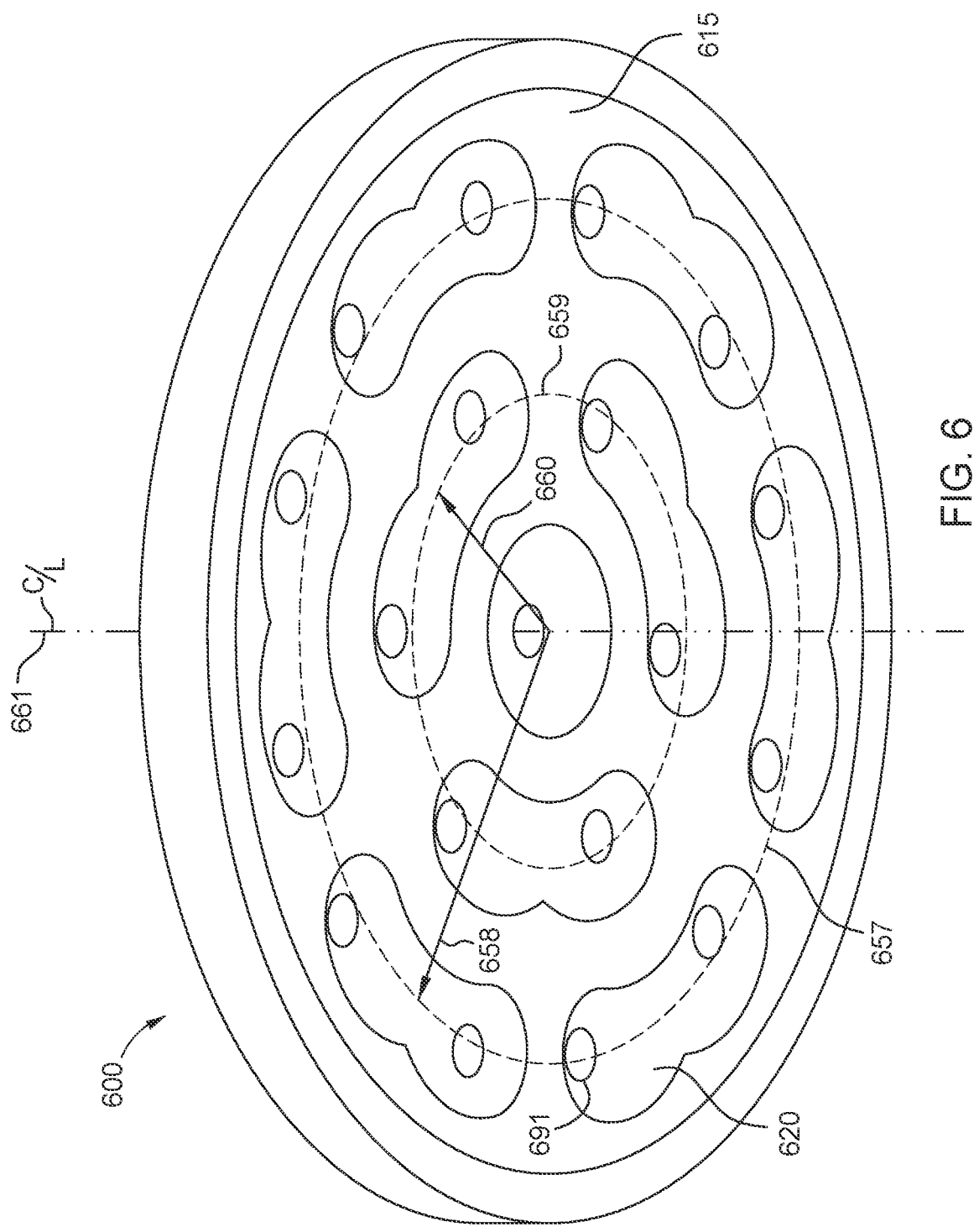
FIG. 6 is a schematic bottom perspective view of a reflector to be used in the processing chamber of FIG. 1, according to one or more embodiments.

FIG. 6 illustrates an embodiment of the reflector assembly 600 that includes a bottom surface 615 of a cylindrical body with a plurality of concave structures 620 illustrated as elephant ear shaped structures arranged in a polar array along common diameters 657, 659, and a heat source socket 691 within the elephant ear shaped structures. The elephant ear shaped structures may house at least one heat source socket 691 per elephant ear portion. The heat source socket 691 are typical heat source connectors to electrically power heat sources used for processing chambers such as the processing chamber 100 in FIG. 1.

In one or more embodiments, the plurality of concave structures 620 have three elephant ear shaped structures aligned in a polar array along a common inner diameter 659 at inner radial distance 660 and five elephant ear shaped structures aligned in a polar array along a common outer diameter 657 at outer radial distance 658 from the centerline 661 of the cylindrical body of the reflector assembly 600. Other embodiments may contain more or less elephant ear shaped structures as shown in FIG. 6 aligned in a polar array along common diameters 657, 659.

In one or more embodiments, the elephant ear shaped structures are nested in alignment. The nested arrangement may be described as the outer portion of each elephant ear shaped structure being straddled by a second elephant ear shaped structure aligned radially outward of the inner elephant ear shaped structure. Therefore, each elephant ear shaped structure may be straddled by two separate elephant ear shaped structures. In one or more embodiments, the reflector assembly 600 may have cut outs to enable an upper temperature sensor (for example the upper temperature sensor 192, such as an upper pyrometer) and/or other sensor to monitor the substrate 102 shown in FIG. 1. The reflector assembly 600 may be manufactured by the metallic alloy discussed herein, and polished and/or coated with an IR transparent protective coating as discussed herein.

Figure 7:
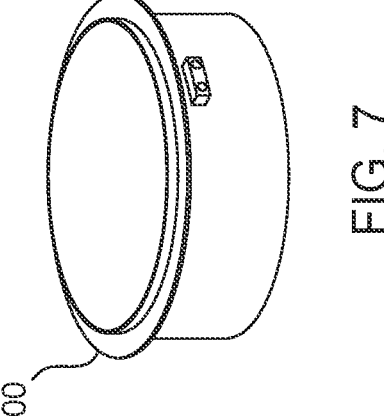
FIG. 7 is a schematic top perspective view of an upper heat shield for a processing chamber, according to according to one or more embodiments.

FIG. 7 is a schematic top perspective view of an upper heat shield 700 for a processing chamber, according to one or more embodiments.

Figure 8:
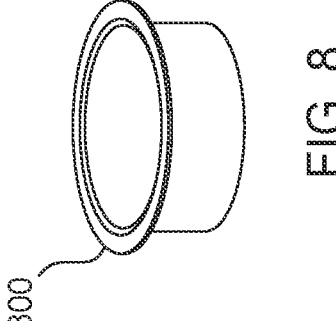
FIG. 8 is a schematic top perspective view of an inner heat shield for a processing chamber, according to according to one or more embodiments.

FIG. 8 is a schematic top perspective view of an inner heat shield 800 for a processing chamber, according to one or more embodiments. The present disclosure contemplates that the shell body 301 and the shell flange 305 can be referred to as at least part of an inner heat shield.

Figure 9:
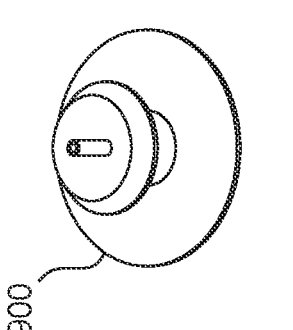
FIG. 9 is a schematic top perspective view of a pyrometer tube shield for a processing chamber, according to according to one or more embodiments.

FIG. 9 is a schematic top perspective view of a pyrometer tube shield 900 for a processing chamber, one or more embodiments. The present disclosure contemplates that the middle baffle 352, the top baffle 354, and the cylindrical sensor tube 356 can be referred to as at least part of a pyrometer tube shield.

One or more of the upper heat shield 700, inner heat shield 800, and/or pyrometer tube shield 900 may be disposed as part of an upper heat source module, such as upper heat source module 155 of processing chamber 100 of FIG. 1. Further, one or more of upper heat shield 700, inner heat shield 800, and/or pyrometer tube shield 900 may be at least partially formed of the metallic alloy with high reflectivity, with or without the IR transparent protective coating discussed herein. As discussed herein various reflective outer surfaces of the upper heat shield 700, the inner heat shield 800, and/or the pyrometer tube shield 900 can be polished to have the surface roughness (Ra) that is 15.0 nm or less (such as 5.0 nm or less), and/or can be coated with the IR transparent protective coating 280.

The inner heat shield 800 can be disposed at least partially within the upper heat shield 700, the pyrometer tube shield 900 can be disposed at least partially within the inner heat shield 800, and the upper reflector 140 can be disposed at least partially between the upper heat shield 700 and the inner heat shield 800.

Figure 10:
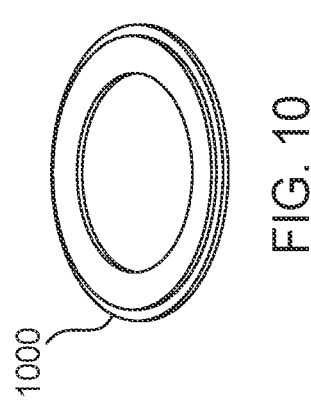
FIG. 10 is a schematic top perspective view of a flat reflector for a processing chamber, according to according to one or more embodiments.

FIG. 10 is a schematic top perspective view of a flat reflector 1000 for a processing chamber, according to one or more embodiments.

Figure 11:
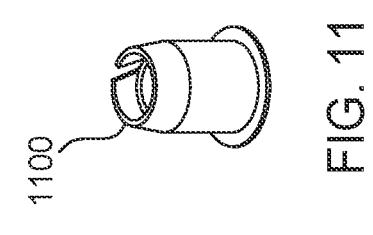
FIG. 11 is a schematic top perspective view of a cone reflector for a processing chamber, according to according to one or more embodiments.

FIG. 11 is a schematic top perspective view of a cone reflector 1100 for a processing chamber, according to one or more embodiments.

Figure 12:
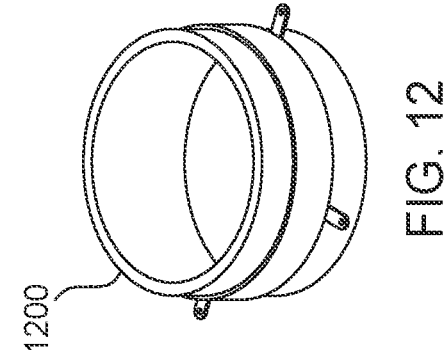
FIG. 12 is a schematic top perspective view of a lower reflector for a processing chamber, according to according to one or more embodiments.

FIG. 12 is a schematic top perspective view of a lower reflector 1200 for a processing chamber, according to one or more embodiments.

Figures 13, 14:
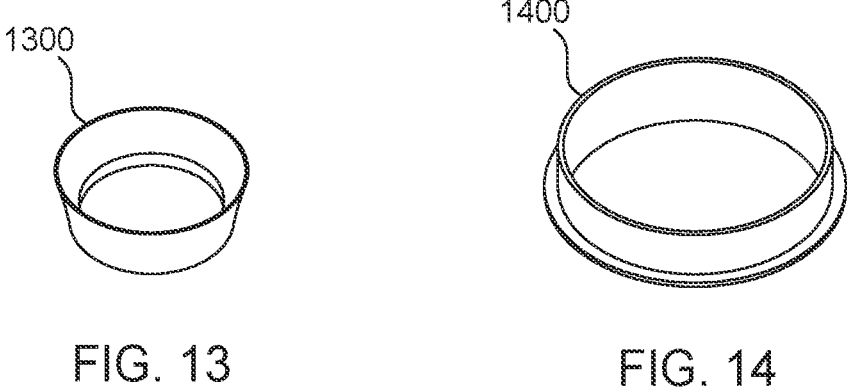
FIG. 13 is a schematic top perspective view of a top reflector for a processing chamber, according to according to one or more embodiments.
FIG. 14 is a schematic top perspective view of a lower heat shield for a processing chamber, according to one or more embodiments.

FIG. 13 is a schematic top perspective view of a top reflector 1300 for a processing chamber, according to one or more embodiments.

FIG. 14 is a schematic top perspective view of a lower heat shield 1400 for a processing chamber, according to one or more embodiments. One or more of the flat reflector 1000, cone reflector 1100, lower reflector 1200, top reflector 1300, and/or lower heat shield 1400 may be disposed as part of a lower heat source module, such as lower heat source module 145 of processing chamber 100 of FIG. 1. Further, one or more of flat reflector 1000, cone reflector 1100, lower reflector 1200, top reflector 1300, and/or lower heat shield 1400 may be at least partially formed of the metallic alloy with high reflectivity, with or without the IR transparent protective coating discussed herein. As discussed herein various reflective outer surfaces of the flat reflector 1000, cone reflector 1100, lower reflector 1200, top reflector 1300, and/or lower heat shield 1400 can be polished to have the surface roughness (Ra) that is 15.0 nm or less (such as 5.0 nm or less), and/or can be coated with the IR transparent protective coating 280.

The lower reflector 1200 can be disposed at least partially within the lower heat shield 1400, the cone reflector 1100 can be disposed at least partially within the lower heat shield 1400, the flat reflector 1000 can be disposed at least partially between the lower heat shield 1400 and the lower reflector 1200, and the lower reflector 130 can be disposed at least partially between the cone reflector 1100 and the lower reflector 1200. The top reflector 1300 can be disposed above (such as on top of) the lower reflector 1200.

Figure 15:
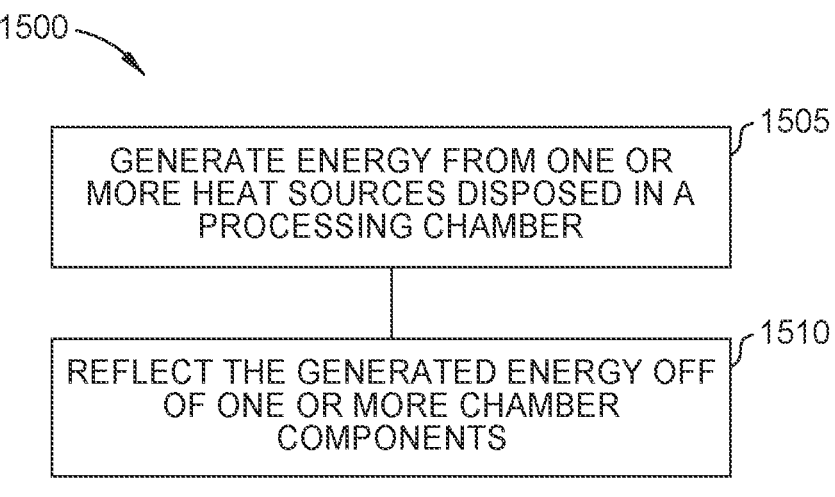
FIG. 15 is a schematic flow diagram of a method of substrate processing, according to one or more embodiments.

FIG. 15 is a schematic flow diagram of a method 1500 of substrate processing, according to one or more embodiments. The method 1500 can include heating a substrate in a processing chamber using one or more metallic alloy light reflectors.

While a few discrete operations are depicted in the exemplary figure, there may be additional operations in method 1500 in various embodiments. The method 1500 can be used with the processing chamber 100 of FIG. 1.

At operation 1505, energy (e.g., light) is generated from one or more heat sources disposed in the processing chamber. In one or more embodiments, the heat sources include the heat sources 141, 143 of FIG. 1. Each of the one or more heat sources are surrounded at least partially by a chamber component, such as the lower reflector 130 or upper reflector 140 of FIG. 1.

At operation 1510, the generated energy is reflected off of one or more chamber components and through a window towards an internal volume of the processing chamber. The generated energy can be reflected towards a substrate support, the substrate, and/or a pre-heat ring. The window may be either of upper window 108 or lower window 110 of FIG. 1. The one or more chamber components include the metallic alloy and one or more reflective surfaces having the surface roughness (Ra) that is 15.0 nanometers or less, such as 5.0 nanometers or less. The one or more chamber components can include for example, any one or more of the heat shields, the reflectors, and/or the pyrometer tube shield described herein.

It is contemplated that one or more aspects disclosed herein may be combined. As an example, one or more aspects, features, components, operations, and/or properties of the various implementations of the processing chamber 100, the controller 120, the upper reflector 140, the reflector assembly 300, the reflector assembly 400, the reflector assembly 500, the reflector assembly 600, the upper heat shield 700, the inner heat shield 800, the pyrometer tube shield 900, the flat reflector 1000, the cone reflector 1100, the lower reflector 1200, the top reflector 1300, the lower heat shield 1400, and/or the method 1500 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A processing chamber applicable for use in semiconductor manufacturing, comprising:
   a chamber body having an internal volume;
   one or more heat sources configured to provide heat to the internal volume;
   a substrate support disposed in the internal volume, the substrate support comprising a support surface;
   an upper window disposed over the substrate support;
   a lower window disposed below the substrate support;
   one or more chamber components positioned to reflect energy emitted from the one or more heat sources through at least one of the upper window or the lower window and into the internal volume, the one or more chamber components comprising an aluminum alloy and one or more reflective surfaces having a surface roughness (Ra) that is 5.0 nanometer or less, wherein:
   the aluminum alloy comprises aluminum and one or more transition metals,
   the aluminum alloy comprises an alloy composition having at least 80% aluminum atomic percentage and at least 5% transition atomic percentage of the one or more transition metals, and
   a sum of the aluminum atomic percentage and the transition atomic percentage is at least 95%.

2. The processing chamber of claim 1, wherein a microstructure of the aluminum alloy is fully amorphous, partially crystalline, or fully crystalline.

3. The processing chamber of claim 1, wherein the one or more transition metals comprise one or more of iron, nickel, copper, manganese, molybdenum, and zirconium.

4. The processing chamber of claim 1, wherein the one or more heat sources are disposed at one or more of: above the upper window or below the lower window.

5. The processing chamber of claim 1, wherein the aluminum alloy has a reflectivity of 95 percent or more.

6. The processing chamber of claim 1, wherein the one or more chamber components further comprise an infrared (IR) transparent protective coating formed on the one or more reflective surfaces.

7. The processing chamber of claim 6, wherein the IR transparent protective coating comprises one or more of a metal oxide layer, a metal fluoride layer, a metal oxyfluoride layer, a stack of layers with different oxides, fluoride, or one or more oxyfluoride compositions.

8. The processing chamber of claim 6, wherein the transparent protective coating comprises a single layer, a double layer structure, a multilayer structure having three or more layers, or a laminated layer structure.

9. A chamber component for use in a semiconductor processing chamber, the chamber component comprising:
   a cylindrical body comprising an aluminum alloy and one or more reflective surfaces having a surface roughness (Ra) that is 5.0 nanometer or less,
   wherein:
   the aluminum alloy comprises aluminum and one or more transition metals,
   the aluminum alloy comprises an alloy composition having at least 80% aluminum atomic percentage and at least 5% transition atomic percentage of the one or more transition metals, and
   a sum of the aluminum atomic percentage and the transition atomic percentage is at least 95%.

10. The chamber component of claim 9, wherein the one or more transition metals comprise one or more of iron, nickel, copper, manganese, molybdenum, and zirconium.

11. The chamber component of claim 9, wherein the aluminum alloy has a reflectivity of 95 percent or more.

12. The chamber component of claim 9, wherein the cylindrical body further comprises an infrared (IR) transparent protective coating.

13. A method for substrate processing for use in semiconductor manufacturing, the method comprising:
   generating energy from the one or more heat sources disposed in the processing chamber of claim 1; and
   reflecting the generated energy off the one or more chamber components and through the upper window or the lower window towards the internal volume of the processing chamber.

14. The method of claim 13, wherein the one or more transition metals comprise one or more of iron, nickel, copper, manganese, molybdenum, and zirconium.

15. The method of claim 13, wherein the aluminum alloy has a reflectivity of 95 percent or more.

* * * * *